United States Patent
Chen et al.

(10) Patent No.: US 10,888,015 B2
(45) Date of Patent: Jan. 5, 2021

(54) CABLE MANAGEMENT ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/815,012

(22) Filed: Mar. 11, 2020

(65) Prior Publication Data
US 2020/0214163 A1    Jul. 2, 2020

Related U.S. Application Data

(63) Continuation of application No. 16/364,097, filed on Mar. 25, 2019, now Pat. No. 10,638,636.

(30) Foreign Application Priority Data

Nov. 23, 2018   (TW) .............................. 107142149 A

(51) Int. Cl.
| | | |
|---|---|---|
| *H02B 1/20* | (2006.01) | |
| *H05K 7/14* | (2006.01) | |
| *H01R 9/24* | (2006.01) | |

(52) U.S. Cl.
CPC ......... *H05K 7/1491* (2013.01); *H01R 9/2416* (2013.01)

(58) Field of Classification Search
USPC ......................................................... 361/826
See application file for complete search history.

(56) References Cited

U.S. PATENT DOCUMENTS

| | | |
|---|---|---|
| 6,600,665 B2 | 7/2003 | Lauchner |
| 7,473,846 B2 | 1/2009 | Doerr |
| 7,554,819 B2 | 6/2009 | Chen |
| 8,045,343 B2 * | 10/2011 | Fan ...................... H05K 7/1491 361/826 |

(Continued)

FOREIGN PATENT DOCUMENTS

TW    200948228    11/2009

*Primary Examiner* — Hung S. Bui
(74) *Attorney, Agent, or Firm* — Winston Hsu

(57) ABSTRACT

A cable management assembly is applied to a first slide rail assembly and a second rail assembly. Each of the slide rail assemblies includes a first rail and a second rail movable relative to the first slide rail. The cable management assembly includes a cable management device and at least one supporting member. The cable management device includes a first arm and a second arm. The first arm is connected to the first rail of the first slide rail assembly. The second arm is pivoted to the first arm and connected to the second rail of the first slide rail assembly. The at least one supporting member includes a first end and a second end. The first end is pivoted to the first rail of the second slide rail assembly. The second end is detachably connected to the first rail of the first slide rail assembly.

12 Claims, 8 Drawing Sheets

(56) References Cited

U.S. PATENT DOCUMENTS

| | | |
|---|---|---|
| 8,387,933 B2 | 3/2013 | Yu |
| 8,816,199 B1 | 8/2014 | French |
| 9,144,174 B2 | 9/2015 | Chen |
| 9,281,676 B2 | 3/2016 | Chen |
| 2004/0120133 A1* | 6/2004 | Nguyen ............... H05K 7/1491 |
| | | 361/825 |
| 2011/0180297 A1 | 7/2011 | Yu |
| 2011/0253647 A1 | 10/2011 | Yu |
| 2012/0012714 A1 | 1/2012 | Rubenstein |
| 2016/0161026 A1 | 6/2016 | Chen |
| 2016/0186895 A1 | 6/2016 | Chen |

* cited by examiner

CABLE MANAGEMENT ASSEMBLY

CROSS REFERENCE TO RELATED APPLICATIONS

This application is a continuation application of U.S. application Ser. No. 16/364,097, filed on Mar. 25, 2019. This application claims the benefit of U.S. application Ser. No. 16/364,097, which was filed on Mar. 25, 2019, and is incorporated herein by reference.

BACKGROUND OF THE INVENTION

1. Field of the Invention

The present invention relates to a cable management assembly, and more particularly, to a cable management assembly capable of managing cables.

2. Description of the Prior Art

In a rack system, a slide rail assembly includes a first rail and a second rail in general. The first rail is mounted on a post of a rack. The second rail is movable relative to the first rail, and the second rail is configured to carry an electronic apparatus. Wherein, in general, a cable is arranged in the rear of the electronic apparatus. Therefore, the cable can be managed through a cable management mechanism.

U.S. Pat. No. 7,473,846 B2 disclose a cable supporting arm able to be used in two-way. The cable supporting arm (24) includes a first arm section (40) and a second arm section (42) rotatably connected to the first arm section (40). As shown in FIG. 9 of the patent, when an electronic apparatus (12) is located at a retracted position through a slide rail (108), the first arm section (40) and the second arm section (42) of the cable supporting arm (24) are closed to each other and retracted. As shown in FIG. 10 of the patent, when the electronic apparatus (12) is located at an extended position through the slide rail (108), first arm section (40) and the second arm section (42) of the cable supporting arm (24) are extended relative to each other.

However, for different market requirements, sometimes the cable supporting arm is not able to steady support the cable of the electronic apparatus (12). In addition, when the cable supporting arm is difficult to be detached, a sub-module of the electronic apparatus (12) may not be easily detached or changed. Therefore, how to develop a cable management product, which is improved the reliability and the ease of assembly and disassembly of the product, has become an issue.

SUMMARY OF THE INVENTION

The present invention provides a cable management assembly applied to a slide rail assembly.

According to an aspect of the present invention, a cable management assembly is applied to a first slide rail assembly and a second slide rail assembly. Each of the first slide rail assembly and the second slide rail assembly includes a first rail and a second rail movable relative to the first rail. The cable management assembly includes a first cable management device and at least one supporting member. The first cable management device includes a first arm and a second arm. The first arm is connected to the first rail of the first slide rail assembly. The second arm is pivoted to the first arm. The second arm is connected to the second rail of the first slide rail assembly. The at least one supporting member includes a first end and a second end. The first end is pivoted to the first rail of the second slide rail assembly. The second end is detachably connected to the first rail of the first slide rail assembly.

Preferably, a first blocking feature is arranged on one of the first arm and the second arm, when the second rail of the first slide rail assembly is located at a retraced position relative to the first rail, the first arm and the second arm are closed to each other to be in a closed state, and the at least one supporting member blocks the first blocking feature.

Preferably, when the first arm and the second arm are in the closed state, the at least one supporting member is configured to support the first cable management device.

Preferably, the first arm is rotatable relative to the first rail of the first slide rail assembly, and the second arm is rotatable relative to the second rail of the first slide rail assembly, when the second end of the at least one supporting member is detached from the first rail of the first slide rail assembly, the at least one supporting member is rotatable through the first end, such that the at least one supporting member no longer blocks the first blocking feature.

Preferably, the cable management assembly further includes a second cable management device, wherein the second cable management device includes a third arm and a fourth arm, the third arm is rotatable relative to the first rail of the second slide rail assembly, the fourth arm is rotatable relative to the second rail of the second slide rail assembly, a second blocking feature is arranged on one of the third arm and the fourth arm, when the second rail of the second slide rail assembly is located at a retraced position relative to the first rail, the third arm and the fourth arm are closed to each other to be in a closed state, and the at least one supporting member blocks the second blocking feature.

Preferably, a first auxiliary member and a second auxiliary member are respectively connected to the second rail of the first slide rail assembly and the second rail of the second slide rail assembly, a height of the first auxiliary member is greater than a height of the first rail of the first slide rail assembly, a height of the second auxiliary member are greater than a height of the first rail of the second slide rail assembly, the second arm of the first cable management device is pivoted to the first arm of the first cable management device through a first shaft member, the second arm of the first cable management device is connected to the first auxiliary member, the fourth arm of the second cable management device is pivoted to the third arm of the second cable management device through a second shaft member, the fourth arm of the second cable management device is connected to the second auxiliary member.

Preferably, at least one cable management feature is arranged on one of the first arm and the second arm of the first cable management device.

Preferably, at least one cable management feature is arranged on one of the third arm and the fourth arm of the second cable management device.

Preferably, a first mounting member is arranged on the first rail of the first slide rail assembly, the second end of the at least one supporting member is detachably mounted on the first mounting member through a second mounting member.

Preferably, the at least one supporting member includes a first supporting member and a second supporting member, the second supporting member is connected to the first supporting member in a stretchable and retractable manner, the first supporting member has the first end, the second supporting member has the second end.

According to another aspect of the present invention, a cable management assembly These and other objectives of the present invention will no doubt become obvious to those of ordinary skill in the art after reading the following detailed description of the preferred embodiment that is illustrated in the various figures and drawings.

DETAILED DESCRIPTION

Figure 1:
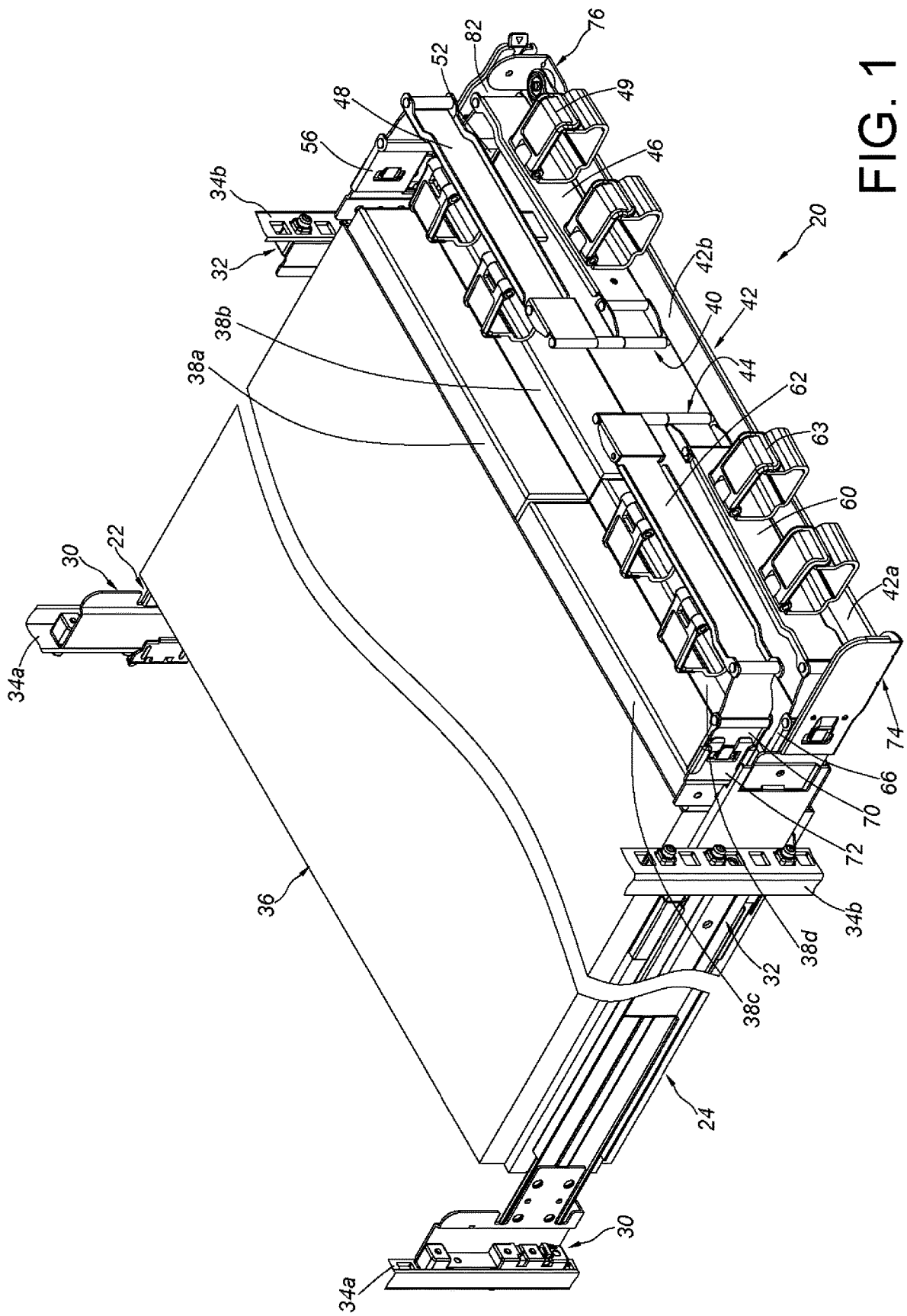
FIG. 1 is a diagram illustrating a cable management assembly applied to a rack system according to an embodiment of the present invention.
Figure 2:
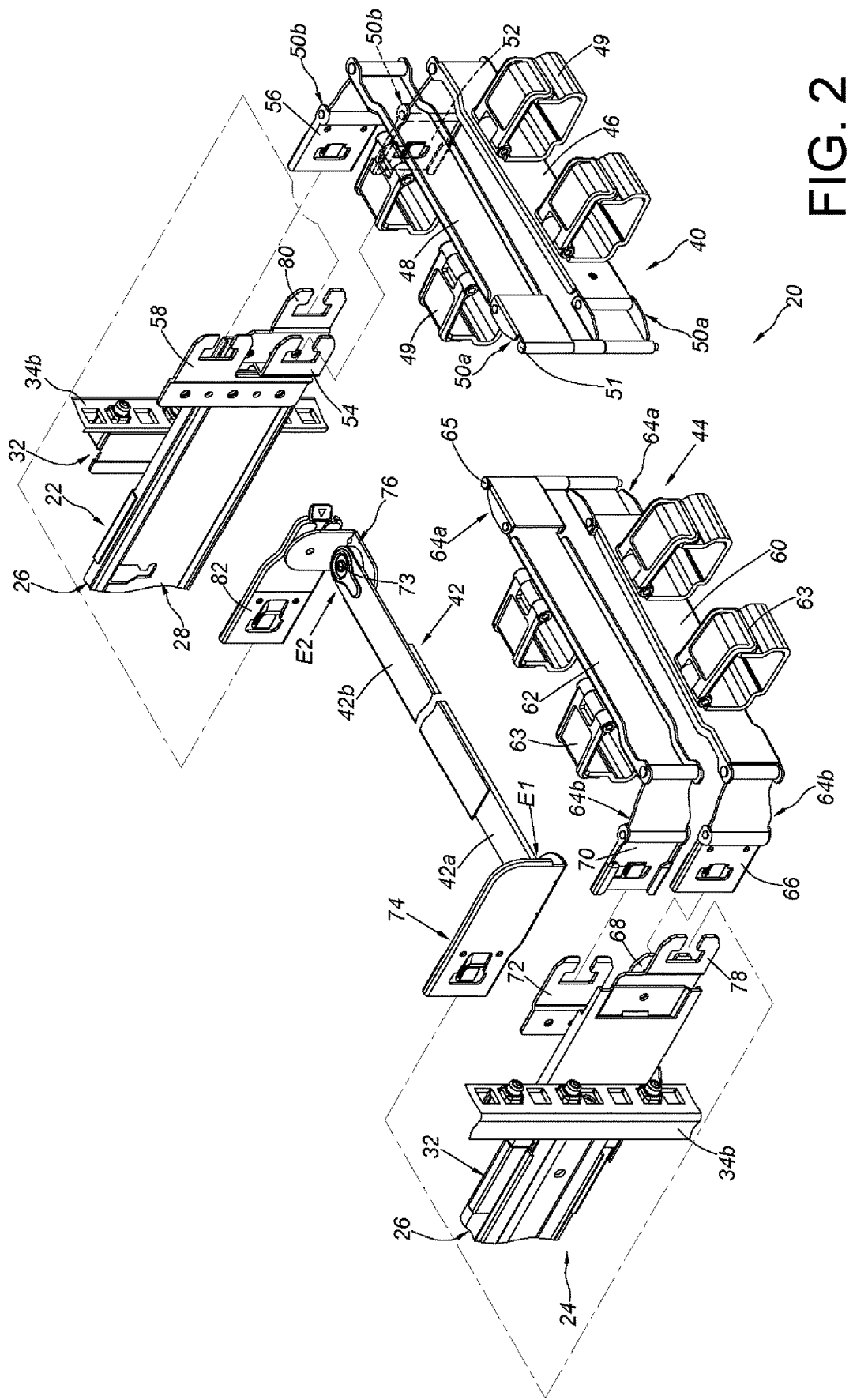
FIG. 2 is an exploded view of the cable management assembly and a slide rail assembly mounted on a rack according to the embodiment of the present invention.
Figure 3:
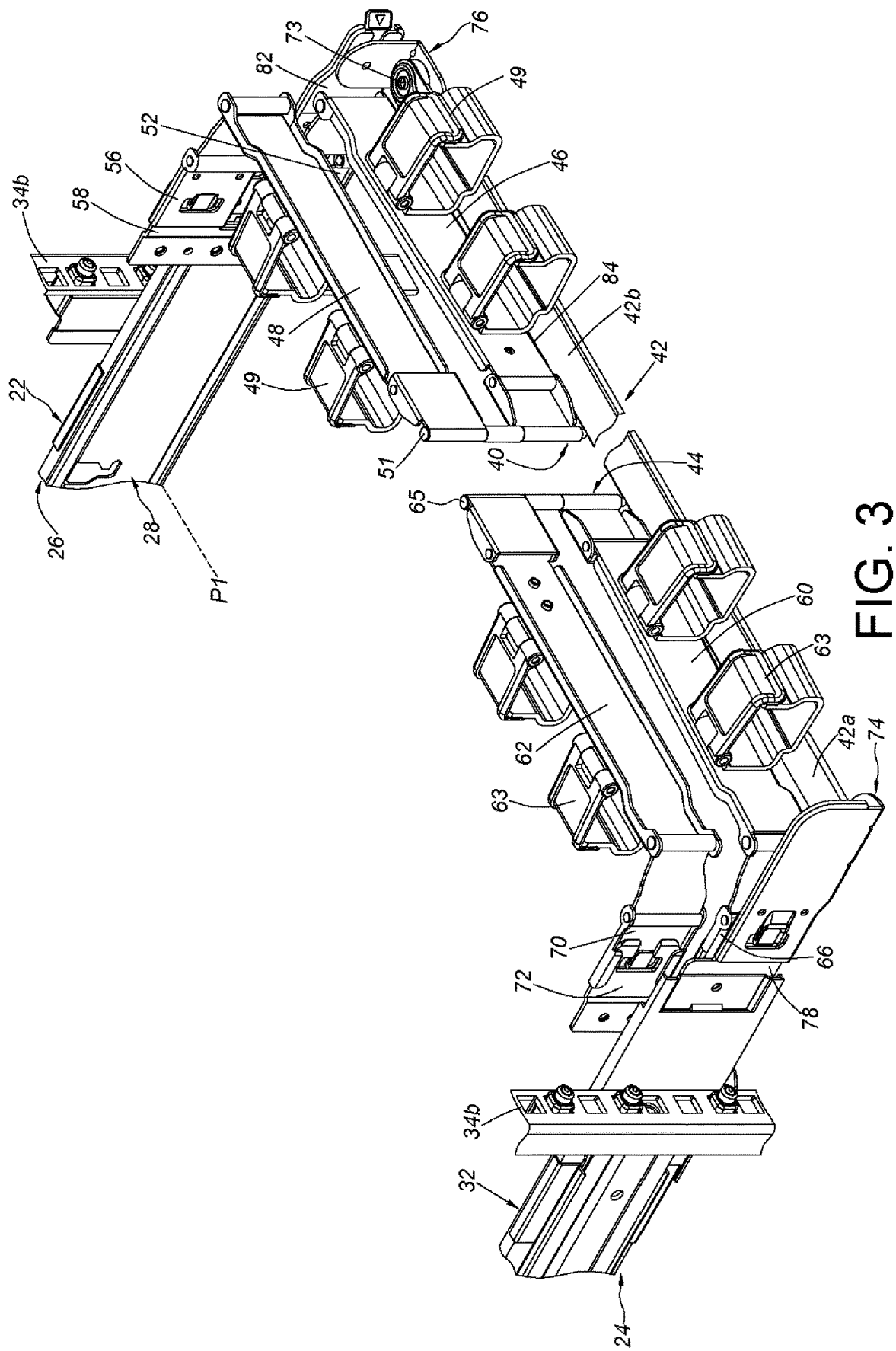
FIG. 3 is a diagram showing a visual angle of the cable management assembly and the slide rail assembly mounted on the rack according to the embodiment of the present invention.

As shown in FIG. 1, FIG. 2 and FIG. 3, a cable management assembly 20 of an embodiment of the present invention is applied to a first slide rail assembly 22 and a second slide rail assembly 24. The first slide rail assembly 22 and the second slide rail assembly 24 have the same structural arrangement substantially. In the present embodiment, the first slide rail assembly 22 and the second slide rail assembly 24 are respectively arranged on a right side and a left side of a rack. Furthermore, the first slide rail assembly 22 and the second slide rail assembly 24 respectively include a first rail 26 and a second rail 28. Wherein, the first rail 26 can be mounted on a first post 34a (such as a front post) and a second post 34b (such as a rear post) through a first bracket 30 (such as a front bracket) and a second bracket 32 (such as a rear bracket). The second rail 28 is longitudinally movable relative to the first rail 26, and the second rail 28 can be configured to carry a carried object 36 (e.g. an electronic apparatus, please refer to FIG. 1). At least one space is formed in the carried object 36 and configured to accommodate an electronic component, a power module, a heat sink module, a storage module or the like. Hereinafter, it is illustrative of an example that the carried object 36 accommodates a first upper layer object 38a, a first lower layer object 38b, a second upper layer object 38c and a second lower layer object 38d. Specifically, each of the objects 38a, 38b, 38c, 38d can be a field replaceable unit (FRU), but the present invention is not limited thereto. The number of the objects in the carried object 36 is not limited thereto. Wherein, the first upper layer object 38a and the first lower layer object 38b are located on right half portion of a space in the carried object 36. The second upper layer object 38c and the second lower layer object 38d are located on left half portion of the space in the carried object 36. Furthermore, the cable management assembly 20 includes a first cable management device 40 and at least one supporting member 42. Preferably, the cable management assembly 20 further includes a second cable management device 44.

The first cable management device 40 includes a first arm 46 and a second arm 48. Preferably, at least one first cable management feature 49 is arranged on the first arm 46 and the second arm 48 of the first cable management device 40. The at least one first cable management feature 49 is able to hold or support cables behind the carried object 36. Preferably, the first arm 46 and the second arm 48 both have a first end portion 50a and a second end portion 50b. Wherein, the first end portion 50a of the first arm 46 is pivoted to the first end portion 50a of the second arm 48. For example, the first end portion 50a of the first arm 46 is pivoted to the first end portion 50a of the second arm 48 through a first shaft member 51. On the other hand, a first corresponding member 52 is pivoted to the second end portion 50b of the first arm 46, and the first corresponding member 52 is connected to (such as detachably connected e.g. engaging or plugging) a first connecting member 54 arranged on a rear portion of the first rail 26 of the first slide rail assembly 22. The second end portion 50b of the first arm 46 is pivoted to the first corresponding member 52. Therefore, the first arm 46 is rotatable relative to the first rail 26 of the first slide rail assembly 22. Moreover, a second corresponding member 56 is pivoted to the second end portion 50b of the second arm 48, and the second corresponding member 56 is connected to (such as detachably connected e.g. engaging or plugging) a first auxiliary member 58 arranged on a rear portion of the second rail 28 of the first slide rail assembly 22. The first auxiliary member 58 has a height greater than a height of the first rail 26 of the first slide rail assembly 22. Wherein, the second end portion 50b of the second arm 48 is pivoted to the second corresponding member 56. Therefore, the second arm 48 is rotatable relative to the second rail 28 of the first slide rail assembly 22.

The second cable management device 44 includes a third arm 60 and a fourth arm 62. Preferably, at least one second cable management feature 63 is arranged on the third arm 60 and the fourth arm 62 of the second cable management device 44. The at least one second cable management feature 63 is able to hold or support cables behind the carried object 36. Preferably, the third arm 60 and the fourth arm 62 both have a first end portion 64a and a second end portion 64b. Wherein, the first end portion 64a of the third arm 60 is pivoted to the first end portion 64a of the fourth arm 62. For example, the first end portion 64a of the third arm 60 is pivoted to the first end portion 64a of the fourth arm 62 through a second shaft member 65. On the other hand, a third corresponding member 66 is pivoted to the second end portion 64b of the third arm 60, and the third corresponding member 66 is connected to (such as detachably connected e.g. engaging or plugging) a second connecting member 68 arranged on a rear portion of the first rail 26 of the second slide rail assembly 24. The second end portion 64b of the third arm 60 is pivoted to the third corresponding member 66. Therefore, the third arm 60 is rotatable relative to the first rail 26 of the second slide rail assembly 24. Moreover, a fourth corresponding member 70 is pivoted to the second end portion 64b of the fourth arm 62, and the fourth corresponding member 70 is connected to (such as detachably connected e.g. engaging or plugging) a second auxiliary member 72 arranged on a rear portion of the second rail 28 of the second slide rail assembly 24. The second auxiliary member 72 has a height greater than a height of the first rail 26 of the second slide rail assembly 24. Wherein, the second end portion 64b of the fourth arm 62 is pivoted to the fourth corresponding member 70. Therefore, the fourth arm 62 is rotatable relative to the second rail 28 of the second slide rail assembly 24.

The at least one supporting member 42 includes a first end E1 and a second end E2. The first end E1 is pivoted to the first rail 26 of the second slide rail assembly 24, and the second end E2 is detachably connected on the first rail 26 of the first slide rail assembly 22. Specifically, the first end E1 and the second end E2 are respectively pivoted to a first connecting base 74 and a second connecting base 76 through a pivot member 73 (the pivot member of the first end E1 and the first connecting base 74 is not shown due to the angle of view). Wherein, the first connecting base 74 is able to be connected to (such as detachably connected e.g. engaging or plugging) a third connecting member 78 of the rear portion of the first rail 26 of the second slide rail assembly 24. Preferably, a gap is formed between the third connecting member 78 and the second connecting member 68. On the other hand, a first mounting member 80 is arranged on the rear portion of the first rail 26 of the first slide rail assembly 22. The second connecting base 76 arranged on the second end E2 of the at least one supporting member 42 is detachably mounted on the first mounting member 80 through a second mounting member 82. For example, the first mounting member 80 can be detachably mounted on the second mounting member 82 by plugging or engaging. Preferably, the second connecting base 76 is able to be detached from the second mounting member 82. Preferably, a gap is formed between the first mounting member 80 and the first connecting member 54. Preferably, in the present embodiment, the at least one supporting member 42 includes a first supporting member 42a and a second supporting member 42b connected to the first supporting member 42a in a stretchable and retractable manner, but the number of supporting members is not limited thereto. Wherein, the first supporting member 42a has the first end E1, and the second supporting member 42b has the second end E2.

It is noticed that when the first cable management device 40 and the second cable management device 44 are retracted, a length of the first cable management device 40 (or a length of the second cable management device 44) is slightly less than half of a length of the at least one supporting member 42. In other words, when the first cable management device 40 and the second cable management device 44 are retracted, a gap is formed between the first cable management device 40 and the second cable management device 44. Therefore, bending radius for cable managing of the first cable management device 40 and the second cable management device 44 can be reduced, in order to facilitate managing cables.

Figure 4:
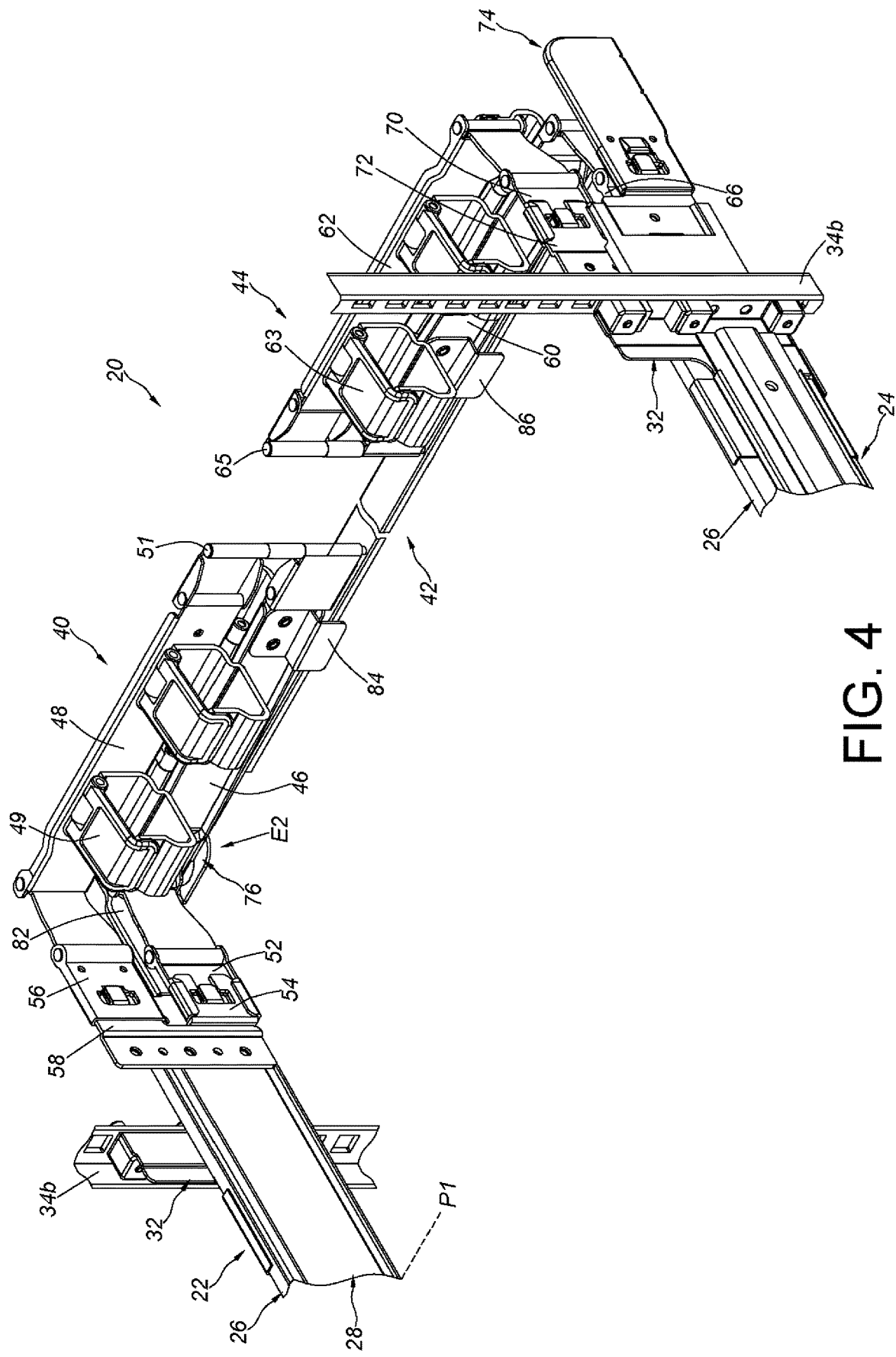
FIG. 4 is a diagram showing another visual angle of the cable management assembly and the slide rail assembly mounted on the rack according to the embodiment of the present invention.

As shown in FIG. 4, a first blocking feature 84 is arranged on one of the first arm 46 and the second arm 48 of the first cable management device 40. Hereinafter, it is illustrative of an example that the first blocking feature 84 is arranged on the first arm 46. Wherein, the first blocking feature 84 and the first arm 46 can be integrally formed in one piece, or the first blocking feature 84 can be a separated component fixedly mounted on the first arm 46. Preferably, a second blocking feature 86 is arranged on one of the third arm 60 and the fourth arm 62 of the second cable management device 44. Hereinafter, it is illustrative of an example that the second blocking feature 86 is arranged on the third arm 60. Wherein, the second blocking feature 86 and the third arm 60 can be integrally formed in one piece, or the second blocking feature 86 can be a separated component fixedly mounted on the third arm 60.

When the second rail 28 of the first slide rail assembly 22 is located at a retracted position P1 relative to the first rail 26, the first arm 46 and the second arm 48 are closed to each other and are in a closed state. When the second end E2 of the at least one supporting member 42 is connected to the first rail 26 of the first slide rail assembly 22, the at least one supporting member 42 blocks the first blocking feature 84, to further block the first cable management device 40. Preferably, when the second rail 28 of the second slide rail assembly 24 is located at a retracted position relative to the first rail 26, the third arm 60 and the fourth arm 62 are closed to each other and are in a closed state. The at least one supporting member 42 blocks the second blocking feature 86, to further block the second cable management device 44. As such, the first cable management device 40 and the second cable management device 44 are arranged to close a rear space behind the first slide rail assembly 22 and the second slide rail assembly 24. In addition, when the first arm 46 and the second arm 48 are closed to each other and are in the closed state, the at least one supporting member 42 is configured to support the first cable management device 40 (such as support a bottom portion of the first cable management device 40). When the third arm 60 and the fourth arm 62 are closed to each other and are in the closed state, the at least one supporting member 42 is configured to support the second cable management device 44 (such as support a bottom portion of the second cable management device 44).

It is noticed that when the at least one supporting member 42 blocks the first blocking feature 84, the first upper layer object 38a or the first lower layer object 38b is blocked by the first cable management device 40 from being detached from the carried object 36 to the rear space behind the first slide rail assembly 22 and the second slide rail assembly 24 (please refer to FIG. 1). Similarly, when the at least one supporting member 42 blocks the second blocking feature 86, the second upper layer object 38c or the second lower layer object 38d is blocked by the second cable management device 44 from being detached from the carried object 36 to the rear space behind the first slide rail assembly 22 and the second slide rail assembly 24 (please refer to FIG. 1).

Figure 5:
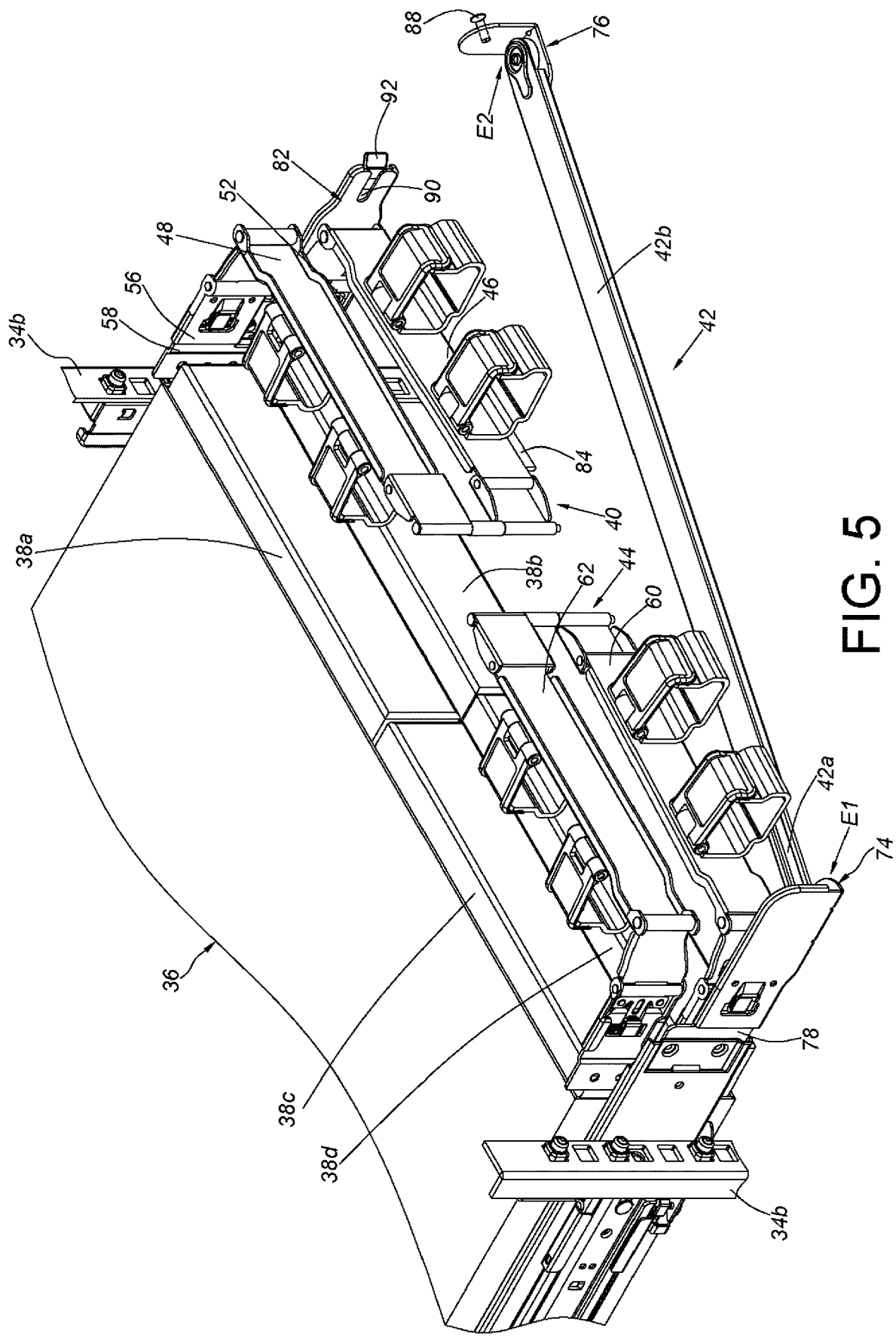
FIG. 5 is a diagram illustrating the cable management assembly mounted on the slide rail assembly on the rack, and an end of a supporting member of the cable management assembly detached from a slide rail according to the embodiment of the present invention.
Figure 6:
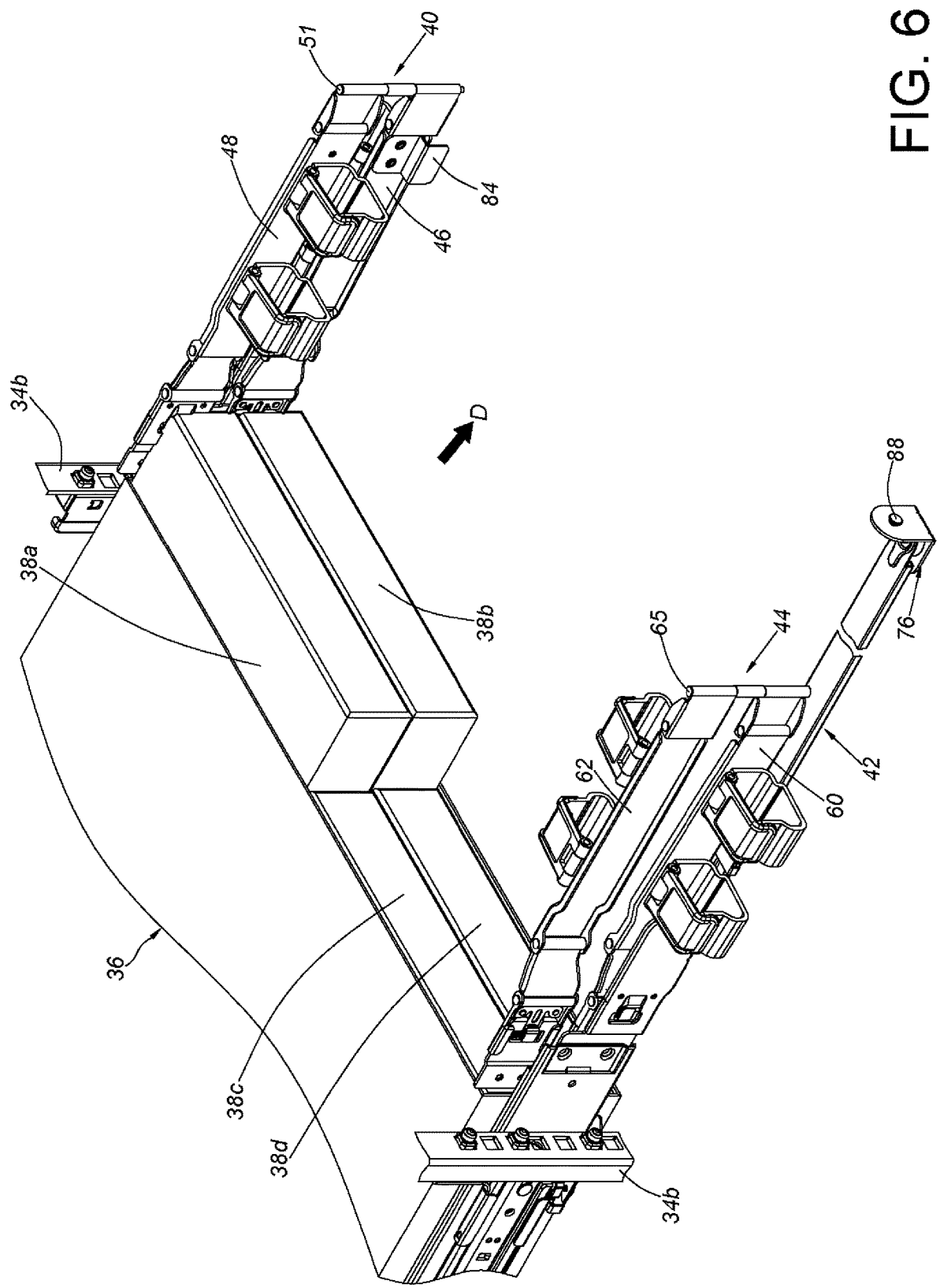
FIG. 6 is diagram illustrating the cable management assembly mounted on the slide rail assembly on the rack, and the supporting member and the cable management device of the cable management assembly rotated to be deflected by an angle to allow a first predetermined object of a carried object to be moved along a direction according to the embodiment of the present invention.

As shown in FIG. 5 and FIG. 6, when the second end E2 of the at least one supporting member 42 is detached from the first rail 26 of the first slide rail assembly 22, the at least one supporting member 42 is able to be rotated through the first end E1 in order to be deflected backward, such that the at least one supporting member 42 no longer blocks the first blocking feature 84 (and the second blocking feature 86), and such that the first cable management device 40 (and the second cable management device 44) is able to be rotated to be deflected backward to open the rear space behind the first slide rail assembly 22 and the second slide rail assembly 24.

It is noticed that, in the present embodiment, the second end E2 of the at least one supporting member 42 is unmounted from the second mounting member 82 through the second connecting base 76, such that the second end E2 of the at least one supporting member 42 is detached from the first rail 26 of the first slide rail assembly 22. For example, the second connecting base 76 includes a fastening member 88 (or a protrusion) able to be mounted in a space 90 of the second mounting member 82. Preferably, an elastic member 92 (e.g. an elastic piece) is operably connected to one of the second mounting member 82 and the second connecting base 76 (for example, the elastic member 92 is operably connected to the second mounting member 82). Wherein, the fastening member 88 is blocked in the space 90 through the elastic member 92 being located at an engaged position, and the elastic member 92 is operable to be located at a disengaged position (please refer to FIG. 5), in order to allow the fastener 88 to be detached from the space 90, such that the second end E2 of the at least one supporting member 42 is unmounted from the second mounting member 82 through the second connecting base 76, to further be detached from the first rail 26 of the first slide rail assembly 22. Alternatively, the second end E2 of the at least one supporting member 42 is able to be unmounted from the first mounting member 80 through the second mounting member 82, such that the second end E2 of the at least one supporting member 42 is detached from the first rail 26 of the first slide rail assembly 22.

As shown in FIG. 6, when the at least one supporting member 42 is rotated through the first end E1 to be deflected backward substantially by an angle of 90 degree and the first cable management device 40 is rotated to be deflected backward by an angle of 90 degree substantially, the first upper layer object 38a and the first lower layer object 38b are no longer blocked by the first cable management device 40, in order to allow the first upper layer object 38a and the first lower layer object 38b to be detached and moved along a rear direction D from the carried object 36. Wherein, the rear direction D and a transverse direction are perpendicular to each other. A height direction and the rear direction D are perpendicular to each other. The height direction and the transverse direction are perpendicular to each other.

Figure 7:
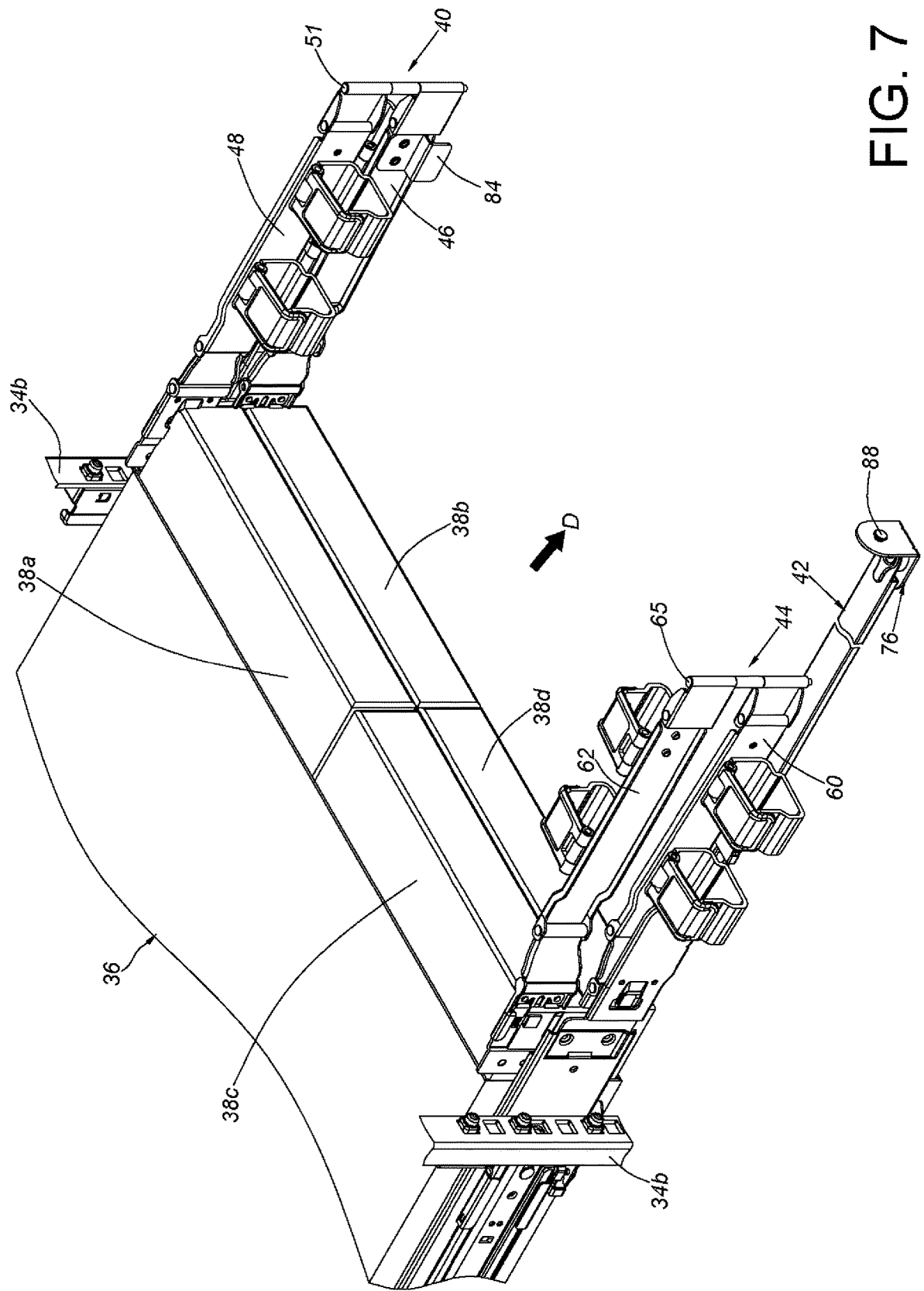
FIG. 7 is diagram illustrating the cable management assembly mounted on the slide rail assembly on the rack, and the supporting member and the cable management device of the cable management assembly rotated to be deflected by an angle to allow a second predetermined object of the carried object to be moved along the direction according to the embodiment of the present invention.

As shown in FIG. 6 and FIG. 7, when the at least one supporting member 42 is rotated through the first end E1 to be deflected backward substantially by an angle of 90 degree and the second cable management device 44 is rotated to be deflected backward by an angle of 90 degree substantially, the second upper layer object 38c and the second lower layer object 38d are no longer blocked by the second cable management device 44, in order to allow the second upper layer object 38c and the second lower layer object 38d to be detached and moved along the rear direction D from the carried object 36.

Figure 8:
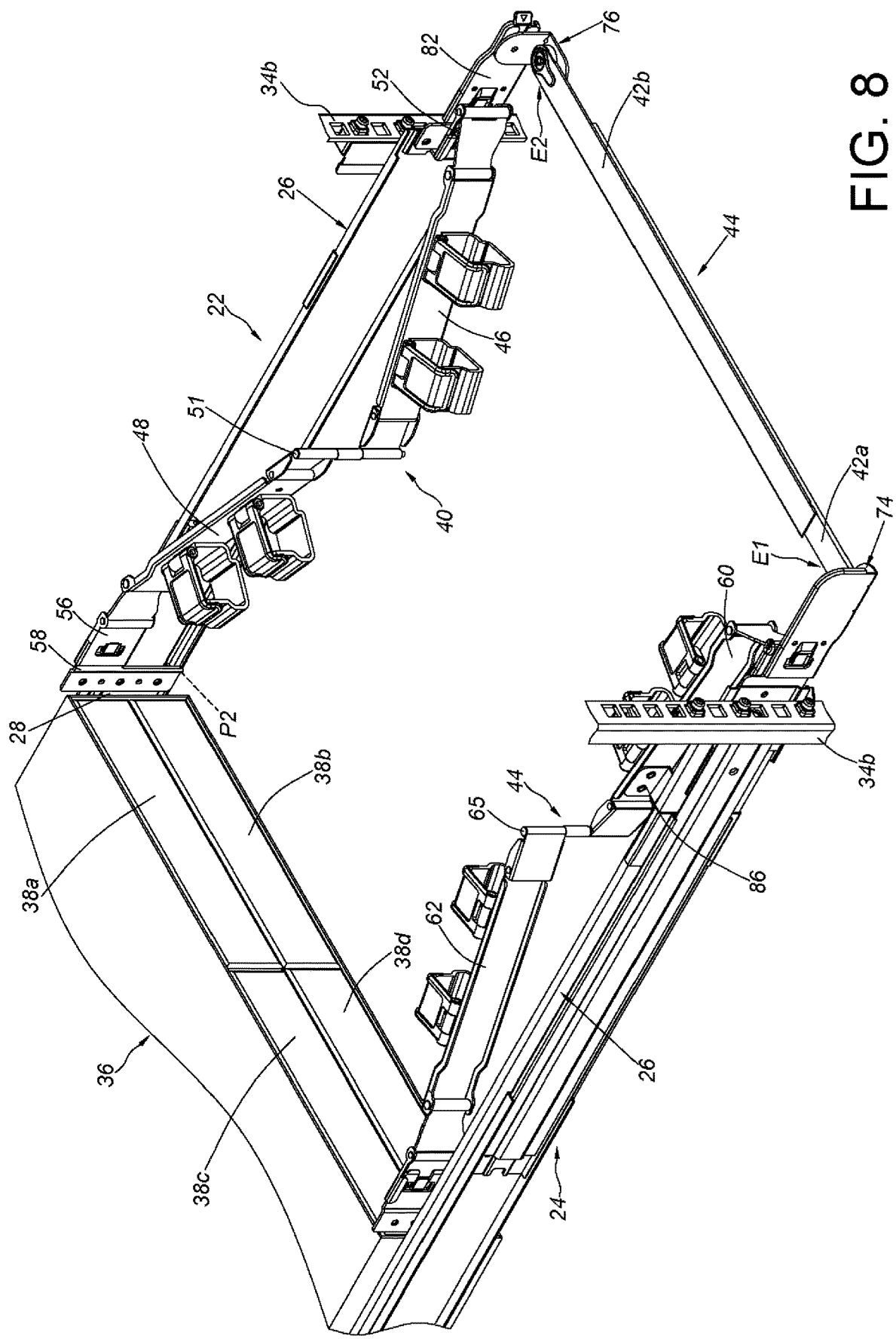
FIG. 8 is diagram illustrating the slide rail assembly being in an extended state, such that the cable management device of the cable management assembly is extended according to the embodiment of the present invention.

As shown in FIG. 1 and FIG. 8, when the carried object 36 is moved relative to the first rail 26 from the retracted position P1 along a front direction (e.g. a direction opposite to the rear direction D) to an extended position P2 through the two second rails 28 of the two slide rail assemblies 22, 24, the first arm 46 and the second arm 48 of the first cable management device 40 are extended relative to each other and are in an extended state, and the third arm 60 and the fourth arm 62 of the second cable management device 44 are also extended relative to each other and are in an extended state.

Compared to the prior art, the cable management assembly 20 of the present invention has advantages over the prior art by the following perspectives:

1. The first end E1 of the at least one supporting member 42 is pivoted to the first rail 26 of the second slide rail assembly 24, the second end E2 is detachably connected to the first rail 26 of the first slide rail assembly 22.

2. The at least one supporting member 42 can block the first cable management device 40 (and the second cable management device 44). When the second end E2 of the at least one supporting member 42 is detached from the first rail 26 of the first slide rail assembly 22, the at least one supporting member 42 is able to be rotated to be deflected by an angle through the first end E1, to allow the objects (38a, 38b, 38c, 38d) to be moved relative to the carried object 36 along a predetermined direction (e.g. a rear direction) to be detached.

3. When the two arms of the first cable management device 40 (and the second cable management device 44) are closed to each other and in the closed state, the at least one supporting member 42 can be configured to support the bottom portion of the first cable management device 40 (and the second cable management device 44).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cable management assembly applied to a first slide rail assembly and a second slide rail assembly, each of the first slide rail assembly and the second slide rail assembly comprising a first rail and a second rail movable relative to the first rail, the cable management assembly comprising:
   a first cable management device, comprising:
      a first arm connected to the first rail of the first slide rail assembly; and
      a second arm pivoted to the first arm and connected to the second rail of the first slide rail assembly; and
   at least one supporting member comprising a first end and a second end, the first end being pivoted to the first rail of the second slide rail assembly, the second end being detachably connected to the first rail of the first slide rail assembly;
   wherein a length of the first cable management device is less than or equal to half of a distance between the first slide rail assembly and the second slide rail assembly;
   wherein a first blocking feature is arranged on one of the first arm and the second arm, when the second rail of the first slide rail assembly is located at a retraced position relative to the first rail, the first arm and the second arm are closed to each other to be in a closed state, and the at least one supporting member blocks the first blocking feature;
   wherein the first arm is rotatable relative to the first rail of the first slide rail assembly, and the second arm is rotatable relative to the second rail of the first slide rail assembly, when the second end of the at least one supporting member is detached from the first rail of the first slide rail assembly, the at least one supporting member is rotatable through the first end, such that the at least one supporting member no longer blocks the first blocking feature;
   wherein the cable management assembly further comprises a second cable management device, the second cable management device comprises a third arm and a fourth arm, the third arm is rotatable relative to the first rail of the second slide rail assembly, the fourth arm is rotatable relative to the second rail of the second slide rail assembly, a second blocking feature is arranged on one of the third arm and the fourth arm, when the second rail of the second slide rail assembly is located at a retraced position relative to the first rail, the third arm and the fourth arm are closed to each other to be in a closed state, and the at least one supporting member blocks the second blocking feature;

wherein a first auxiliary member and a second auxiliary member are respectively connected to the second rail of the first slide rail assembly and the second rail of the second slide rail assembly, a height of the first auxiliary member is greater than a height of the first rail of the first slide rail assembly, a height of the second auxiliary member is greater than a height of the first rail of the second slide rail assembly, the second arm of the first cable management device is pivoted to the first arm of the first cable management device through a first shaft member, the second arm of the first cable management device is connected to the first auxiliary member, the fourth arm of the second cable management device is pivoted to the third arm of the second cable management device through a second shaft member, the fourth arm of the second cable management device is connected to the second auxiliary member.

2. The cable management assembly of claim 1, wherein when the first arm and the second arm are in the closed state, the at least one supporting member is configured to support the first cable management device.

3. The cable management assembly of claim 1, wherein at least one cable management feature is arranged on one of the first arm and the second arm of the first cable management device.

4. The cable management assembly of claim 3, wherein at least one cable management feature is arranged on one of the third arm and the fourth arm of the second cable management device.

5. The cable management assembly of claim 1, wherein a first mounting member is arranged on the first rail of the first slide rail assembly, the second end of the at least one supporting member is detachably mounted on the first mounting member through a second mounting member.

6. The cable management assembly of claim 1, wherein the at least one supporting member comprises a first supporting member and a second supporting member, the second supporting member is connected to the first supporting member in a stretchable and retractable manner, the first supporting member has the first end, the second supporting member has the second end.

7. A cable management assembly applied to a first slide rail assembly and a second slide rail assembly, each of the first slide rail assembly and the second slide rail assembly comprising a first rail and a second rail movable relative to the first rail in a longitudinal direction of the first rail, wherein the first rail extends in the longitudinal direction, the cable management assembly comprising:
  a first cable management device, comprising:
    a first arm connected to the first rail of the first slide rail assembly; and
    a second arm pivoted to the first arm and connected to the second rail of the first slide rail assembly; and
  at least one supporting member comprising a first end and a second end, the first end being pivoted to the first rail of the second slide rail assembly, the second end being detachably connected to the first rail of the first slide rail assembly;
wherein the first arm and the second arm of the first cable management device are arranged with each other in a direction substantially parallel to a height direction of the first rail perpendicular to the longitudinal direction;

wherein a first blocking feature is arranged on one of the first arm and the second arm, when the second rail of the first slide rail assembly is located at a retraced position relative to the first rail, the first arm and the second arm are closed to each other to be in a closed state, and the at least one supporting member blocks the first blocking feature;

wherein the first arm is rotatable relative to the first rail of the first slide rail assembly, and the second arm is rotatable relative to the second rail of the first slide rail assembly, when the second end of the at least one supporting member is detached from the first rail of the first slide rail assembly, the at least one supporting member is rotatable through the first end, such that the at least one supporting member no longer blocks the first blocking feature;

wherein the cable management assembly further comprises a second cable management device, the second cable management device comprises a third arm and a fourth arm, the third arm is rotatable relative to the first rail of the second slide rail assembly, the fourth arm is rotatable relative to the second rail of the second slide rail assembly, a second blocking feature is arranged on one of the third arm and the fourth arm, when the second rail of the second slide rail assembly is located at a retraced position relative to the first rail, the third arm and the fourth arm are closed to each other to be in a closed state, and the at least one supporting member blocks the second blocking feature;

wherein a first auxiliary member and a second auxiliary member are respectively connected to the second rail of the first slide rail assembly and the second rail of the second slide rail assembly, a height of the first auxiliary member is greater than a height of the first rail of the first slide rail assembly, a height of the second auxiliary member are greater than a height of the first rail of the second slide rail assembly, the second arm of the first cable management device is pivoted to the first arm of the first cable management device through a first shaft member, the second arm of the first cable management device is connected to the first auxiliary member, the fourth arm of the second cable management device is pivoted to the third arm of the second cable management device through a second shaft member, the fourth arm of the second cable management device is connected to the second auxiliary member.

8. The cable management assembly of claim 7, wherein when the first arm and the second arm are in the closed state, the at least one supporting member is configured to support the first cable management device.

9. The cable management assembly of claim 7, wherein at least one cable management feature is arranged on one of the first arm and the second arm of the first cable management device.

10. The cable management assembly of claim 9, wherein at least one cable management feature is arranged on one of the third arm and the fourth arm of the second cable management device.

11. The cable management assembly of claim 7, wherein a first mounting member is arranged on the first rail of the first slide rail assembly, the second end of the at least one supporting member is detachably mounted on the first mounting member through a second mounting member.

12. The cable management assembly of claim 7, wherein the at least one supporting member comprises a first supporting member and a second supporting member, the second supporting member is connected to the first supporting member in a stretchable and retractable manner, the first supporting member has the first end, the second supporting member has the second end.

* * * * *